United States Patent
Schwarzband (10) Patent No.: US 7,310,796 B2
(45) Date of Patent: Dec. 18, 2007

(54) SYSTEM AND METHOD FOR SIMULATING AN AERIAL IMAGE

(75) Inventor: Ishai Schwarzband, Or-Yehuda (IL)

(73) Assignee: Applied Materials, Israel, Ltd., Rehovot (IL)

( * ) Notice: Subject to any disclaimer, the term of this patent is extended or adjusted under 35 U.S.C. 154(b) by 515 days.

(21) Appl. No.: 10/928,390

(22) Filed: Aug. 27, 2004

(65) Prior Publication Data
US 2006/0048089 A1 Mar. 2, 2006

(51) Int. Cl.
*G06F 17/50* (2006.01)
(52) U.S. Cl. ......................................... 716/19; 716/21
(58) Field of Classification Search ............ 716/19–21; 382/144; 430/5, 30
See application file for complete search history.

(56) References Cited

U.S. PATENT DOCUMENTS

| 6,223,139 B1 | 4/2001 | Wong et al. | |
|---|---|---|---|
| 2002/0062206 A1 | 5/2002 | Liebchen | |
| 2005/0149900 A1* | 7/2005 | Laidig | 716/19 |
| 2005/0149902 A1* | 7/2005 | Shi et al. | 716/21 |
| 2005/0185159 A1* | 8/2005 | Rosenbluth et al. | 355/53 |

FOREIGN PATENT DOCUMENTS

EP 1202119 5/2002

OTHER PUBLICATIONS

Von Bunau, "Depth of Focus Enhancement in Optical Lithography" (PH.D. dissertation, Stanford University, Stanford, California, 1995).

Toh, et al., in "Identifying and Monitoring Effects of lens Aberrations on Projection Printing", Proceedings of the SPIE Microlithography Conference (1987), pp. 202-209.

Born & Wolf in Principles of Optics, 4th edition (Pergamon Press, 1970), in Section 9.2, pp. 464-467.

Ronald L. Gordon, et al., "Lithographic Image Simulation for the 21st Century with 19th-Century Tools", 2002.

S. Subramanian, "Rapid Calculation of Defocused Partially Coherent Images", Applied Optics, vol. 20, No. 10, May 1981.

R.M. Von Bunau, et al., "Optimal Coherent Decompositions for Radially Symmetric Optical Systems", J. Vac. Technol. B 15(6), Nov./Dec. 1997.

(Continued)

*Primary Examiner*—Paul Dinh
(74) *Attorney, Agent, or Firm*—Tarek N. Fahmi (57) ABSTRACT

Simulated aerial images for an optical system are made by forming a reference aerial image of a first mask used in connection with the optical system, and then capturing and processing the reference aerial image to generate a set of expansion functions representative of the optical system. The expansion functions account for aberrations and misalignment of the optical system, as well as any aberrations or other defects of a camera therein. The expansion functions are then used to compute simulated aerial images of other masks projected by the optical system. Thus, the expansion functions implicitly represent a calibration of the optical system for purposes of aerial image simulation, obviating the need for direct measurement of the actual aberrations and misalignment. Hence, a simulated aerial image of a second mask for the optical system can be computed by applying the expansion functions to a design of the second mask.

21 Claims, 4 Drawing Sheets

OTHER PUBLICATIONS

Y.C. Pati, et al., "Exploiting Structure in Fast Aerial Image Computation for Integrated Circuit Patterns", IEEE Transactions on Semiconductor Manufacturing, vol. 10, No. 1, Feb. 1997.

Oscar D. Crisalle, et al., "A Comparison of the Optical Projection Lithography Simulators in Sample and Prolith", IEEE Transactions on Semiconductor Manufacturing, vol. 5, No. 1, Feb. 1992.

* cited by examiner

SYSTEM AND METHOD FOR SIMULATING AN AERIAL IMAGE

CROSS-REFERENCE TO RELATED APPLICATION

This application is related to U.S. patent application Ser. No. 10/928,537, filed on even date (Aug. 27, 2004), entitled "Simulation of Aerial Images," which is assigned to the assignee of the present patent application and whose disclosure is incorporated herein by reference.

FIELD OF THE INVENTION

The present invention relates generally to photolithography, and specifically to simulation of aerial images produced by projecting a mask onto a target surface.

BACKGROUND OF THE INVENTION

Photolithography is an essential tool in reproduction of fine patterns on a substrate, and is very widely used in production of microelectronic devices. As the design rules used in such devices become ever finer, mask designers must increasingly resort to reticle enhancement technologies, such as the use of serifs, assist lines and phase shift masks, in order to project the desired pattern onto the device substrate. The aerial image that is actually formed on the substrate is a complex function of the characteristics of the illumination source and optics that are used in the lithographic process and of diffraction and interference effects caused by the structures on the mask itself. Mask designers need simulation systems that model these effects in order to predict the pattern that will be formed on the substrate by particular arrangements of mask features.

Simulation of the aerial image is complicated by the fact that practical lithography systems use partially-coherent illumination. For optical systems that are nearly paraxial, the intensity of the aerial image at the image plane with partially-coherent illumination of the mask is given by the well-known Hopkins formula:

$$I(\vec{z}) = \int_\Xi \int_\Xi g(\vec{x}_1) \cdot g^*(\vec{x}_2) \cdot K(\vec{z}, \vec{x}_1) \cdot \qquad (1)$$
$$K^*(\vec{z}, \vec{x}_2) \cdot h(\vec{x}_1, \vec{x}_2) d\vec{x}_1 \cdot d\vec{x}_2$$

Here g is the transmission function of the mask; h is the mutual coherence function of the illumination source (typically the Fourier transform of the condenser aperture function); and K is the point spread function (PSF) of the projection system. The function h can be expressed in terms of a hermitian matrix. Formula (1) is a quadruple integral, taken over the two-dimensional space $\Xi$ in the mask plane. Accurate, direct computation of this integral is computationally heavy and requires precise knowledge of the optical system properties, as expressed by K and h. In some formulations, the properties of the optical system are expressed more compactly in the form of a kernel function $W=K \cdot h$.

In order to reduce the complexity of aerial image simulation, a number of authors have suggested using optimal coherent decomposition (OCD) to approximate the optical properties of the partially-coherent imaging system as an incoherent sum of a finite number of coherent imaging systems. The aerial images that would be formed by each of the coherent imaging systems are computed and summed together to give the total, simulated aerial image. Pati et al. provide a useful overview of OCD methods in "Exploiting Structure in Fast Aerial Image Computation for Integrated Circuit Patterns," *IEEE Transactions on Semiconductor Manufacturing* 10:1 (February, 1997), pages 62-73, which is incorporated herein by reference. This article describes the use of "basis" (or building block) images, which correspond to certain types of integrated circuit patterns, in order to compute aerial images by OCD.

Von Bunau et al. describe a related method of OCD in "Optimal Coherent Decompositions for Radially Symmetric Optical Systems," *Journal of Vacuum Science and Technology* B15:6 (November/December, 1997), pages 2412-2416, which is incorporated herein by reference. The authors show that for optical systems that are radially symmetrical, the point spread functions and pupil functions corresponding to each term in the OCD expansion are separable in polar coordinates. They derive analytical expressions for the angular dependence of these terms and an integral equation for the radial dependence.

A number of methods for aerial image simulation have been described in the patent literature. For example, U.S. Pat. No. 6,223,139, whose disclosure is incorporated herein by reference, describes a method for kernel-based fast aerial image computation for a large-scale design of integrated circuit patterns. The method is based on determining an appropriate sampling range and sampling interval for use in generating simulated aerial images of a mask pattern, so as to enhance computation speed without sacrificing accuracy. U.S. Patent Application Publication 2002/0062206, whose disclosure is also incorporated herein by reference, describes a method for fast aerial image simulation, using a kernel that is calculated based on an orthogonal pupil projection of the parameters of the optical projection system onto a basis set. A vector is calculated based on an orthogonal mask projection of the parameters of the mask onto the basis set, and the field intensity distribution in the image plane is then calculated using the kernel and the vector.

SUMMARY OF THE INVENTION

The references cited in the Background of the Invention describe methods for simulating an aerial image assuming that the properties of the optical system used to project the image are known. Even when the optical system design is precisely known, however, the actual projection system may vary from the design specifications due to factors such as manufacturing tolerances and imprecise alignment of the optical components. Therefore, even if the Hopkins equation (or its eigenfunctions) were computed with high precision, the resulting simulated aerial image for a given mask might still deviate significantly from the actual aerial image created by projecting the mask using the optical system in question.

In response to this deficiency, embodiments of the present invention provide methods and systems for calibrating an aerial image simulator so as to model the actual properties of a given optical projection system. In some embodiments, the optical system is used to project a reference aerial image of a predetermined reference mask, and this image is captured electronically, typically using an electronic imaging camera. (In the context of the present patent application and in the claims, the term "mask" should be understood to comprise substantially any sort of object carrying a pattern that can be projected onto a target plane, and the term "camera" should be understood to refer to any suitable type of imaging device.) The reference aerial image is then processed in order to extract a set of expansion functions, which approximate the eigenfunctions of the kernel function W that represents the optical properties of the actual optical system in question.

The expansion functions that are determined in this manner account for the actual aberrations and misalignment of the optical system, as well as any aberrations or other defects of the camera. These expansion functions may then be used in accurate computation of simulated aerial images of other masks projected by this optical system. Thus, the expansion functions implicitly represent a calibration of the optical system for purposes of aerial image simulation. This implicit calibration obviates the need for direct measurement of the actual aberrations and misalignment.

In some embodiments, the optical system in question is part of a mask inspection system, which captures and processes aerial images of a mask under inspection in order to detect microscopic defects in the mask. The actual aerial image of the mask under inspection is compared to a simulated image that is computed based on the mask design and on the expansion functions that were determined based on the reference mask, as described above. Significant differences between the actual and simulated images can be attributed to defects in the mask under inspection. Because the expansion functions accurately represent the performance of the actual optical system (including the camera), the threshold for identifying a difference as "significant" can generally be set lower than in mask inspection systems known in the art.

There is therefore provided, in accordance with an embodiment of the present invention, a method for generating a simulated aerial image, including:

forming a reference aerial image of a first mask using an optical system;

capturing and processing the reference aerial image so as to generate a set of expansion functions representative of the optical system; and computing the simulated aerial image of a second mask by applying the expansion functions to a design of the second mask.

In a disclosed embodiment, the first mask includes a pseudo-noise pattern. The pseudo-noise pattern may be characterized by a transmission function g that approximates a condition:

$$\int\int g(\vec{x}-\vec{z}_1)\cdot g(\vec{x}-\vec{z}_2)\cdot g(\vec{x}-\vec{z}_3)\cdot g(\vec{x}-\vec{z}_4)d\vec{x}=G\delta(\vec{z}_1-\vec{z}_3,\vec{z}_2-\vec{z}_4),$$

wherein G is a constant.

Typically, processing the reference aerial image includes finding the set of expansion functions so as to minimize a difference between the reference aerial image formed using the system and a simulation of the reference aerial image computed using the expansion functions. In disclosed embodiments, finding the expansion functions includes determining a kernel function based on properties of the optical system, and estimating a series of eigenfunctions of the kernel function. In some of these embodiments, finding the expansion functions includes expressing each of the expansion functions as a linear combination of the estimated eigenfunctions multiplied by respective expansion coefficients, and determining the expansion coefficients so as to minimize the difference between the reference aerial image formed using the system and the simulation of the reference aerial image.

In one embodiment, determining the expansion coefficients includes computing a gradient of the difference with respect to the expansion coefficients, and optimizing the expansion coefficients using the gradient. In another embodiment, determining the expansion coefficients includes defining a hermitian matrix based on the expansion coefficients, and applying a linear regression analysis to the difference between the reference aerial image formed using the system and the simulation of the reference aerial image in order to compute elements of the hermitian matrix.

In a disclosed embodiment, capturing the reference aerial image includes capturing the image using a camera having optical properties, and processing the reference aerial image includes determining the expansion functions so as to take into account the optical properties of the camera.

In some embodiments, the method includes forming and capturing an actual aerial image of the second mask using the optical system, and comparing the actual aerial image to the simulated aerial image so as to evaluate the second mask. Comparing the actual aerial image to the simulated aerial image may include detecting a difference between the actual aerial image to the simulated aerial image, and identifying a defect in the second mask if the difference is greater than a predetermined threshold.

There is also provided, in accordance with an embodiment of the present invention, apparatus for modeling an optical system, including:

a camera, which is adapted to capture a reference aerial image of a first mask, which image is formed using the optical system; and an image processor, which is adapted to process the reference aerial image so as to generate a set of expansion functions representative of the optical system, and to compute a simulated aerial image of a second mask by applying the expansion functions to a design of the second mask.

There is additionally provided, in accordance with an embodiment of the present invention, apparatus for mask inspection, including:

an optical system, which is adapted to form aerial images of masks, the aerial images including a reference aerial image of a first mask and an actual aerial image of a second mask;

a camera, which is adapted to capture the aerial images formed by the optical system; and an image processor, which is adapted to process the reference aerial image so as to generate a set of expansion functions representative of the optical system, and to compute a simulated aerial image of a second mask by applying the expansion functions to a design of the second mask, and to compare the actual aerial image to the simulated aerial image so as to evaluate the second mask.

There is further provided, in accordance with an embodiment of the present invention, a computer software product for modeling an optical system, the product including a computer-readable medium, in which program instructions are stored, which instructions, when read by a computer, cause the computer to process a reference aerial image of a first mask, which image is formed using the optical system, so as to generate a set of expansion functions representative of the optical system, and to compute a simulated aerial image of a second mask by applying the expansion functions to a design of the second mask.

The present invention will be more fully understood from the following detailed description of the embodiments thereof, taken together with the drawings in which:

DETAILED DESCRIPTION OF EMBODIMENTS

Figure 1:
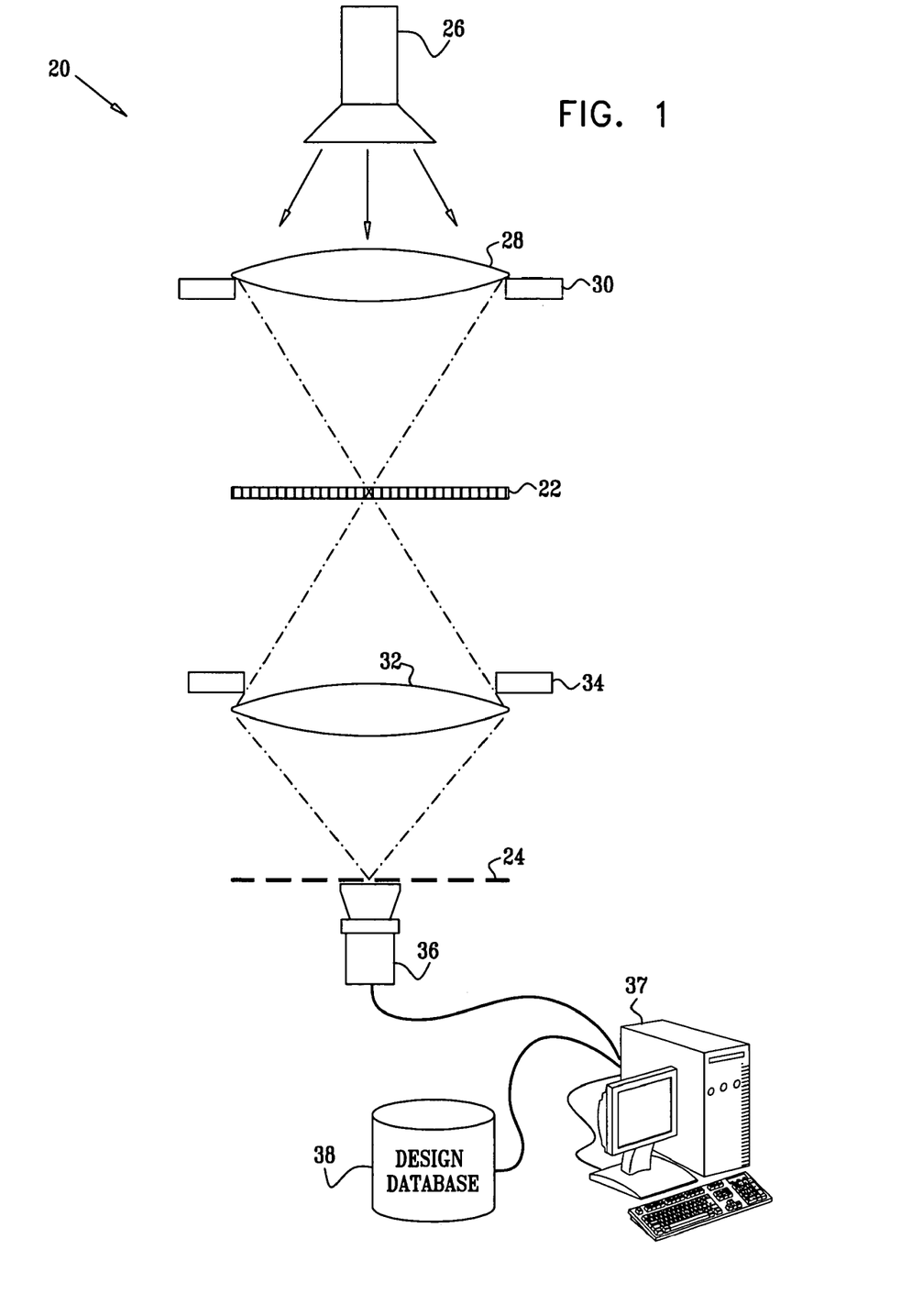
FIG. 1 is a schematic side view of a system for mask projection and inspection, in accordance with an embodiment of the present invention.

FIG. 1 is a schematic side view of a system 20 for projection of a mask 22 onto a target plane 24, in accordance with an embodiment of the present invention. Typically, mask 22 embodies a predetermined design for a thin film layer that is to be formed by photolithography on a substrate at plane 24, as is known in the art. The design is characterized by a complex transmission function $g(\vec{x})$. Alternatively, system 20 may be used in projection of patterns of other types. As noted above, the term "mask" should be understood to comprise substantially any sort of object carrying a pattern that can be projected in this manner onto a target plane. Furthermore, the principles of the present invention may also be applied in projection systems that are based on reflection of radiation from mask 22. For example, these principles may be applied in measuring devices based on optical microscopy systems, which are used in metallurgy and other fields.

System 20 comprises an illumination source 26, which emits radiation, typically comprising visible, ultraviolet or infrared radiation. A condenser lens 28, followed (in this example) by an aperture 30, focuses the light from source 26 through mask 22. A projection lens 32, having an aperture 34, focuses an aerial image of mask 22 onto plane 24. Typically, lenses 28 and 32 include complex, multi-element lenses.

In a disclosed embodiment, system 20 is used for inspection of mask 22, for purposes of detecting mask defects. For this purpose, an electronic imaging camera 36, such as a video camera or other two-dimensional array camera, or a line scan camera, captures the actual aerial image formed at plane 24 with high resolution. An image processor 37 also generates a simulated aerial image, based on the known design of mask 22, which is stored in a design database 38. The mask design determines the transmission function $g(\vec{x})$. The simulated aerial image is computed, based on $g(\vec{x})$ and on a set of expansion functions representing the optical characteristics of system 20. These expansion functions are computed using novel calibration techniques that are described hereinbelow. Image processor 37 compares the actual aerial image to the simulated aerial image in order to detect discrepancies between the two, which may be indicative of defects in mask 22.

Image processor 37 typically comprises a general-purpose computer, which performs the functions described in the present patent application under the control of suitable software. The software may be downloaded to the computer in electronic form, over a network, for example, or it may alternatively be provided on tangible media, such as optical or magnetic media or non-volatile memory. Alternatively or additionally, at least some of the functions of the image processor may be performed by dedicated or programmable hardware components, such as a digital signal processor.

Figure 2:
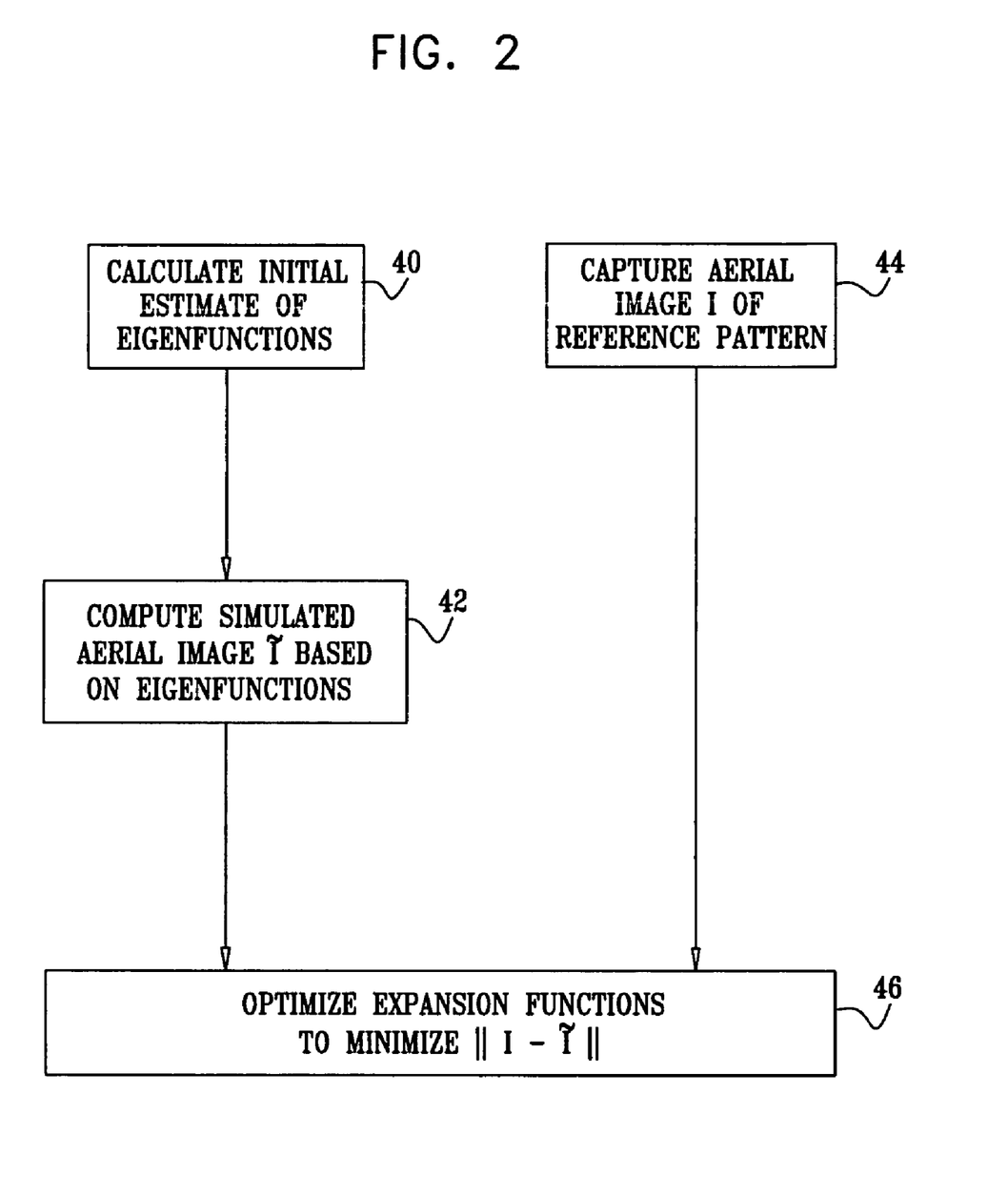
FIG. 2 is a flow chart that schematically illustrates a method for calibrating an optical projection system in terms of a set of expansion functions, in accordance with an embodiment of the present invention.

FIG. 2 is a flow chart that schematically illustrates a method for calibrating an optical projection system in terms of a set of expansion functions, in accordance with an embodiment of the present invention. The method is based on an eigenfunction representation of the kernel W of equation (1):

$$W(\vec{x}_1, \vec{x}_2) = \sum_{i=1}^{n} \Phi_i(\vec{x}_1) \cdot \Phi_i^*(\vec{x}_2) \tag{2}$$

wherein $\Phi_i$ are the denormalized eigenfunctions of the kernel. Equation (2) assumes that the PSF (K) of the optical system is position-independent over the area of interest in target plane 24. It also assumes that the influence of imperfections in camera 36 on images captured by the camera can be expressed as a linear filtering operation in the target plane:

$$C(\vec{z}) = C_h * I(\vec{z}) \tag{3}$$

wherein $C_h$ is an impulse reaction of the filter, and the operator "*" represents convolution. Based on these assumptions, K can be modified to include the influence of the camera together with the projection optics, while the kernel W remains hermitian. Equation (1) can then be rewritten:

$$I(\vec{z}) = \sum_{i=1}^{n} \left| \int_{\vec{z}-\Xi} g(\vec{z}-\vec{x}) \cdot \Phi_i(\vec{x}) \cdot d\vec{x} \right|^2 \tag{4}$$

wherein I now represents the actual electronic image captured by camera 36. The derivation of equation (4) is given in greater detail in Appendix A below.

As noted earlier, it is practically very difficult to directly compute the exact eigenfunctions $\Phi_i$. Therefore, the method of FIG. 2 is directed to finding a set of expansion functions $\tilde{\Phi}_i$ which estimate the eigenfunctions of W. To begin this process, an initial estimate $\tilde{\Phi}_i$ of the set of eigenfunctions is calculated, at an initial estimation step 40. Various methods are known in the art for calculating such an estimate based on the optical design parameters of system 20. For example, one suitable method is described in the above-mentioned U.S. patent application entitled "Simulation of Aerial Images." The estimate can take into account factors such as the numerical apertures and configuration of the condenser and objective optics, coherence ratio, aperture shape and optical aberrations, inter alia. Other exemplary methods for eigenfunction calculation that may be used at step 40 are described by von Bunau, in "Depth of Focus Enhancement in Optical Lithography" (Ph.D. dissertation, Stanford University, Stanford, Calif., 1995), Appendix A.2, and by Toh et al., in "Identifying and Monitoring Effects of Lens Aberrations on Projection Printing," *Proceedings of the SPIE Microlithography Conference* (1987), pages 202-209. Both of these publications are incorporated herein by reference.

Based on the estimated eigenfunctions, an initial simulated aerial image $\tilde{I}$ is computed, at an image estimation step 42, using equation (4):

$$\tilde{I}_\Phi(\vec{z}) = \sum_{i=1}^{n} \left| \int_{\vec{z}-\Xi} g(\vec{z}-\vec{x}) \cdot \tilde{\Phi}_i(\vec{x}) \cdot d\vec{x} \right|^2 \quad (5)$$

$$= \sum_{i=1}^{n} |g * \tilde{\Phi}_i|^2$$

The transmission function g in this case refers to a reference mask, having a known pattern without defects. An actual, reference aerial image I of this reference mask is projected and captured by system 20, at an image capture step 44. The set of expansion functions $\tilde{\Phi}_i$ is then found, at an optimization step 46, so as to minimize the difference between the actual aerial image captured at step 44 and a simulated aerial image based on the expansion functions:

$$\hat{\tilde{\Phi}}_i = \underset{\tilde{\Phi}_i}{\operatorname{argmin}} \| I(\vec{z}) - \tilde{I}_\Phi(\vec{z}) \| \quad (6)$$

Here the norm $\|\cdot\|$ ideally represents the Chebyshev norm ($L_\infty$). Alternatively, for greater ease of analytical development, the norm $$L_{2n} = \sqrt[2n]{\sum |x_i|^{2n}}$$

may be used. Note that $L_{2n}$ approaches the Chebyshev norm as n approaches infinity.

The formulation of the expansion functions in equation (6) does not guarantee that these expansion functions will be the eigenfunctions of W. Nevertheless, if the reference mask transmission function g is sufficiently representative of the characteristics of other masks that are to be projected by system 20, the expansion functions given by equation (6) can serve as a good approximation of the eigenfunctions. A series of 20-30 expansion functions of this sort (corresponding approximately to the first 20-30 eigenfunctions of W) is typically sufficient to give simulated aerial images that match the corresponding actual images to within one gray level unit.

Figure 3:
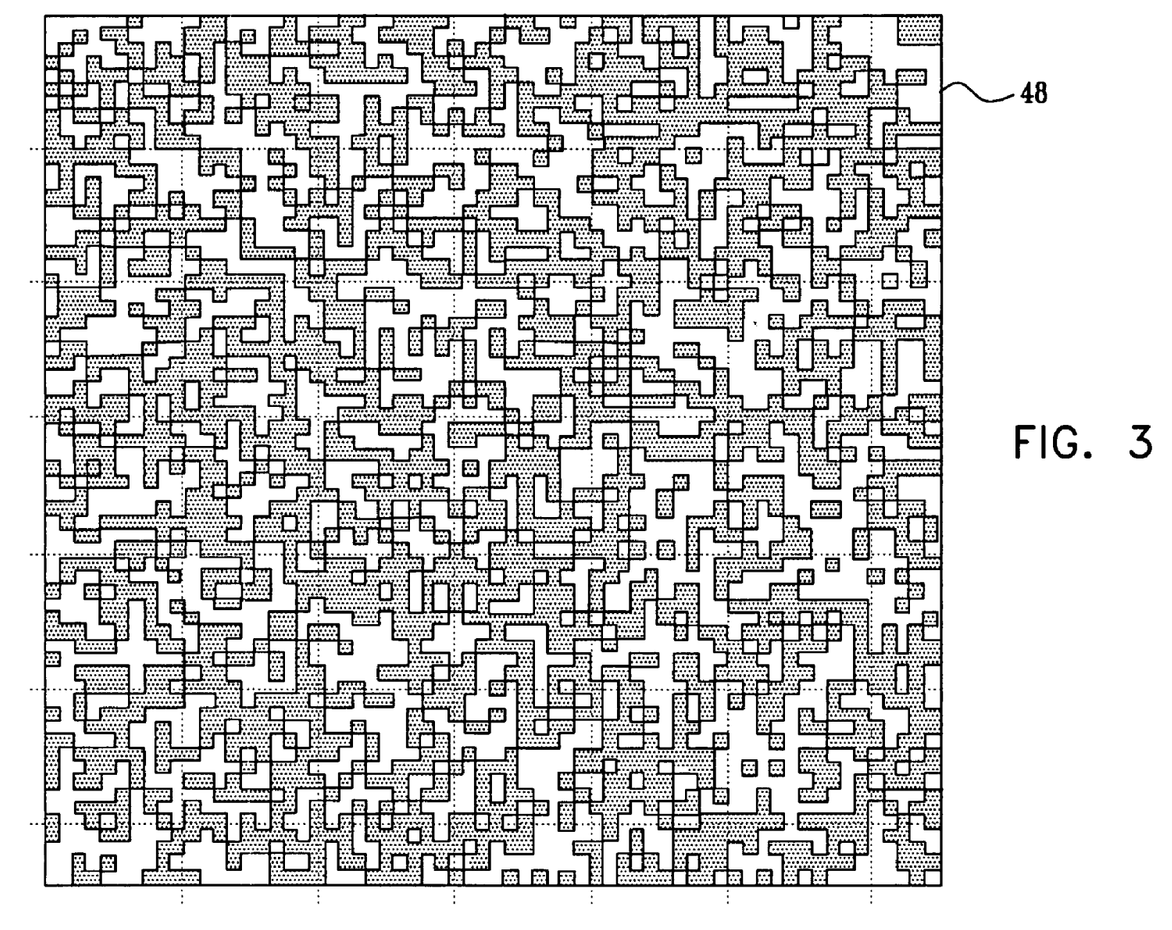
FIG. 3 is a schematic, frontal view of a reference mask for use optical system calibration, in accordance with an embodiment of the present invention.

FIG. 3 is a schematic front view of a reference mask 48, in accordance with an embodiment of the present invention. The mask has a pseudo-noise pattern, whose transmission function g approximates the condition:

$$\int\int g(\vec{x}-\vec{z}_1) \cdot g(\vec{x}-\vec{z}_2) \cdot g(\vec{x}-\vec{z}_3) \cdot g(\vec{x}-\vec{z}_4) d\vec{x} = G\delta(\vec{z}_1-\vec{z}_3, \vec{z}_2-\vec{z}_4) \quad \text{[equation (7)]}$$

Here G is a constant, and $\vec{z}_j$ (j=1, 2, 3, 4) are arbitrary vectors. Mask 48 is shown here only by way of example. Other sorts of reference masks may also be used and are considered to be within the scope of the present invention.

Returning now to step 46 and equation (6), various methods may be used to determine the expansion functions. One possibility is to find the expansion functions iteratively, in decreasing order of the corresponding eigenvalues:

$$I_0(\vec{z}) = I(\vec{z}) \quad (8)$$

$$\hat{\tilde{\Phi}}_i = \underset{\tilde{\Phi}_i}{\operatorname{argmin}} \| I_i(\vec{z}) - |g * \tilde{\Phi}_i|^2 \| \quad (9)$$

$$I_{i+1}(\vec{z}) = I_i(\vec{z}) - \left| g * \hat{\tilde{\Phi}}_i \right|^2 \quad (10)$$

The computation of equations (9) and (10) is repeated iteratively until the entire set of expansion functions is found. At each step, the next expansion function is found so as to minimize the remainder of the image. This method is conceptually straightforward, but computationally complex because of the large dimensions of the eigenfunctions. Alternatively or additionally, the equations may be solved by manipulating discretized values of the functions in the equations, or by manipulating parameters in a parameterized expansion of the functions.

For example, the expansion functions may be expressed as linear combinations of the initial estimates of the eigenfunctions, $\tilde{\Phi}_{0k}$, which were found at step 40:

$$\hat{\tilde{\Phi}}_i = \sum_{k=1}^{n} a_{ik} \cdot \tilde{\Phi}_{0k} \quad (11)$$

Here the expansion coefficients $a_{ik}$ are scalar products given by $a_{ik} = \langle \tilde{\Phi}_{0k}, \tilde{\Phi}_i \rangle$. This approach makes use of the orthogonality of the eigenfunctions and assumes that the subspace spanned by the initial estimates of the eigenfunctions is close to that spanned by the true eigenfunctions $\Phi_k$. As the initial estimates of the eigenfunctions $\tilde{\Phi}_{0k}$ approach the true eigenfunctions $\Phi_k$, the matrix of coefficients a approaches the identity matrix. Equation (5) may be re-expressed in terms of the $a_{ik}$ coefficients as:

$$\tilde{I}_a = \sum_{k,l=1}^{n} \left( \sum_{i=1}^{n} a_{ik} \cdot a_{il}^* \right) \circ \Psi_k \circ \Psi_l^* \quad (12)$$

wherein "$\circ$" designates element-wise multiplication (so that each element in the resulting matrix is the product of the corresponding elements in the multiplicand matrices), and $\Psi_k = g * \tilde{\Phi}_{0k}$. In other words, $\Psi_k$ represent precomputed "images" of the reference mask, which are multiplied and summed to give the complete simulated image.

Equation (6) may now be restated and solved, at step 46, in terms of the $a_{ik}$ coefficients. Various methods may be used in order to find the optimal set of coefficients. One method is to express equation (6) as a parametrized minimization problem in $L_{2n}$ space:

$$\hat{a} = \underset{a}{\operatorname{argmin}} V_a \quad (13)$$

wherein $V_a = \|D_a\|_{2n}$, and $D_a = I(\vec{z}) - \tilde{I}_a(\vec{z})$. The gradient d of the minimized form $V_a$ can be expressed as a complex nxn matrix with elements given by:

$$\operatorname{Re}(d_{nm}) \equiv \frac{\partial (V_a)}{\partial \operatorname{Re}(a_{nm})} \text{ and } \operatorname{Im}(d_{nm}) \equiv \frac{\partial (V_a)}{\partial \operatorname{Im}(a_{nm})} \quad (14)$$

The gradient elements may then be expressed in terms of the $a_{ik}$ coefficients as follows:

$$\dot{d}_{nm} = 4n \cdot \int_\Xi D_a^{2n-1}(\vec{z}) \circ \Psi_m^*(\vec{z}) \circ \left( \sum_{k=1}^n a_{nk} \cdot \Psi_k(\vec{z}) \right) dz \quad (15)$$

The derivation of equation (15) is given in greater detail in Appendix B.

Equation (13) may now be solved by optimization methods known in the art, such as the method of steepest descent, conjugate gradient method or other gradient-based method, using the gradient given by equation (15). For example, using the steepest descent method, the $a_{ik}$ coefficients may be found iteratively according to the following procedure:

$$\hat{a}^{(0)} = 1 \text{ (identity matrix)}$$

$$\hat{a}^{(i+1)} = \hat{a}^{(i)} - \mu \cdot d \quad (16)$$

wherein μ is a convergence factor. Another alternative is to find a hessian matrix of $V_a$ using equation (15), and then to minimize $V_a$ on this basis.

Alternatively, the $a_{ik}$ coefficients may be found indirectly using a linear regression model. For this purpose, we define a matrix $b = a \cdot a^h$, wherein $a^h$ is the hermitian transpose of a, i.e., the matrix elements of b are given by $$b_{kl} = \sum_{i=1}^n a_{ik} \cdot a_{il}^*.$$

We can then restate equation (12) as follows:

$$\tilde{I}_b = \sum_{k,l=1}^n b_{kl} \cdot \Psi_k \circ \Psi_l^* \quad (17)$$

Because the matrix b is hermitian, equation (17) can be rewritten as $$\tilde{I}_b = 2 \cdot \operatorname{Re}\left( \sum_{k=1}^n \sum_{l=1}^{k-1} b_{kl} \cdot \Psi_k \circ \Psi_l^* \right) + \sum_{k=1}^n b_{kk} \cdot \Psi_k \circ \Psi_k^* \quad (18)$$

$$= \sum_{p=1}^P (\operatorname{Re} b_p \cdot u_p + \operatorname{Im} b_p \cdot v_p)$$

This simplified expression uses the following substitutions:

$p = k \cdot n + 1, \; 1 = \ldots k, \; P = n^*(n+1)/2$ $u_p = 2 \cdot \operatorname{Re}(\Psi_k \circ \Psi_l^*)$ for $k \neq 1$ $u_p = \Psi_k \circ \Psi_k^*$ for $k=1$ $v_p = -2 \cdot \operatorname{Im}(\Psi_k \circ \Psi_l^*)$ for $k \neq 1$ $v_p = 0$ for $k=1$ Note that the functions $u_p$ and $v_p$ can be precomputed based on the design properties of the reference mask and optical system, before the calibration procedure of FIG. 2 begins.

Using the formulation of equation (18), equation (6) can be expressed as parameterized minimization problem in the space of the Chebyshev norm ($L_\infty$):

$$\hat{b} = \operatorname*{argmin}_b \max_{\vec{z}} \left( \left| I(\vec{z}) - \tilde{I}_b(\vec{z}) \right| \right) \quad (19)$$

Standard methods of linear regression may be used to calculate Re(b) and Im(b). The matrix a can then be obtained from b, at step 46, using the definition given above, i.e., $b = a \cdot a^h$. For example, since b is hermitian, a can be found as a matrix made up of the denormalized eigenvectors of b.

Figure 4:
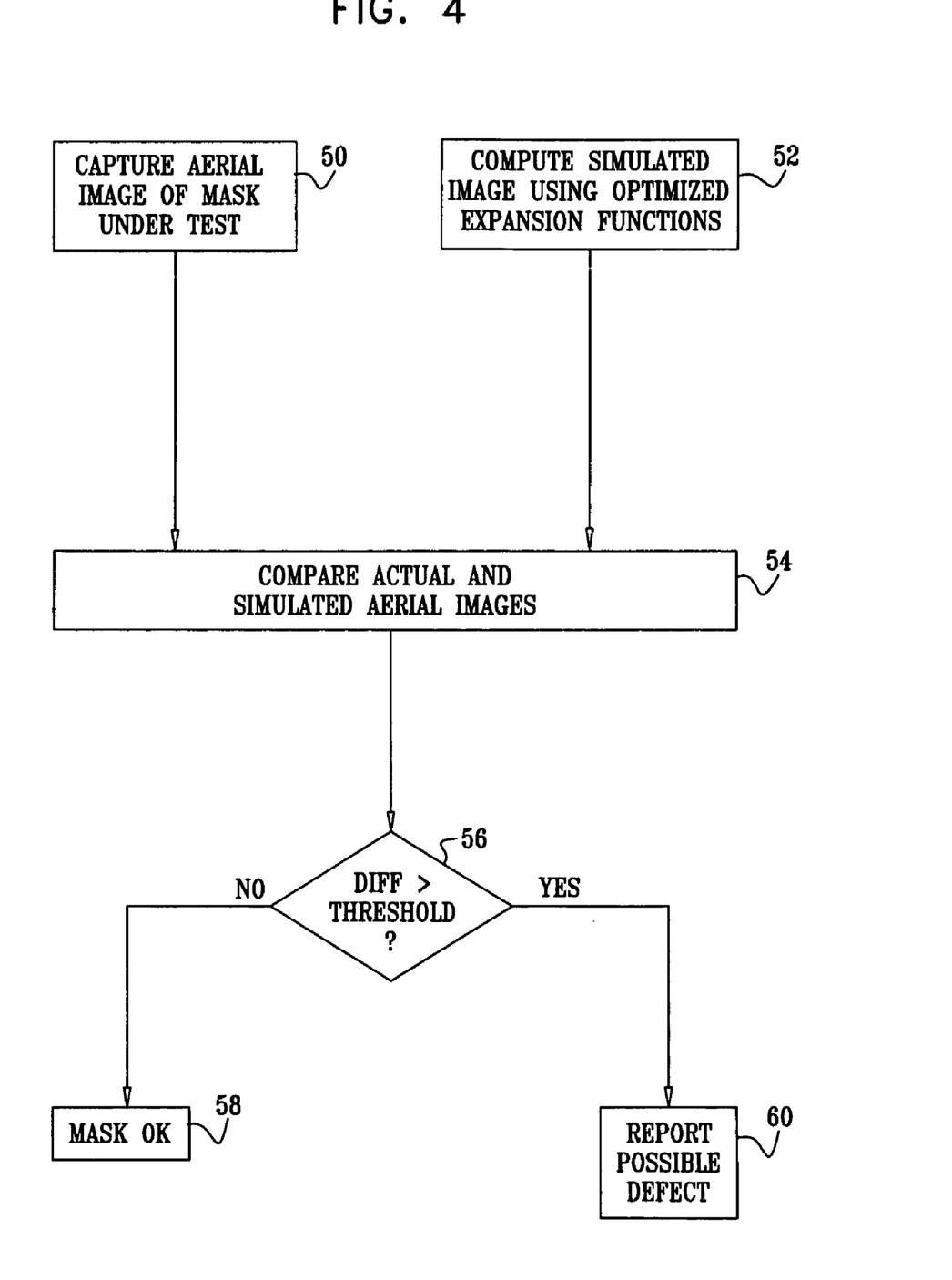
FIG. 4 is a flow chart that schematically illustrates a method for mask inspection, in accordance with an embodiment of the present invention.

FIG. 4 is a flow chart that schematically illustrates a method for mask inspection, in accordance with an embodiment of the present invention. This method makes use of the optimized expansion functions $\hat{\Phi}_i$ found for system 20, using the method of FIG. 2, as described above. A mask under inspection is inserted in system 20, and camera 36 captures an actual aerial image of the mask, at an imaging step 50. Image processor 37 reads the design of this same mask from database 38, which gives the transmission function g of the mask. The image processor inserts the expansion functions and the transmission function into equation (4) in order to calculate a simulated aerial image of the mask under inspection, at a simulation step 52.

Image processor 37 compares the actual image to the simulated image, pixel by pixel, at an image comparison step 54. Where differences occur in the pixel gray levels, the image processor examines the difference between the actual and simulated images (at the level of individual pixels or groups of pixels), in order to determine whether the difference exceeds a predetermined threshold criterion, at a thresholding step 56. If all the differences between the actual and simulated images are below threshold, image processor 37 reports that the mask under inspection is free of defects, at an approval step 58. Otherwise, if any differences in excess of the threshold are found, the image processor 37 reports the existence of a possible defect at the location on the mask corresponding to the image pixel at which the difference was found, at a defect reporting step 60. Additional automated and/or operator-initiated inspection and image processing steps may be performed at these possible defect locations in order to determine the cause of the deviation in the actual image.

Although the embodiment of FIG. 4 is directed specifically to mask inspection, the principles of the present invention may also be applied in generating simulated aerial images for other purposes. For example, mask designers may use expansion functions of the types described above in order to simulate the performance of a mask under design in an actual photolithography system in which the mask is to be used. Furthermore, as noted above, the principles of the present invention may be applied in other fields, such as optical microscopy.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

Appendix A—Derivation of the Simulated Image Model

The PSF (K) in general is not spatially shift-invariant in the target (image) plane. Nevertheless, it is reasonable to assume that the PSF can be decomposed into the product of a slow position-dependant component $K_s$ and a fast position-independent component $K_f$. Then equation (1) can be rewritten as follows:

$$I(\vec{z}) = |K_S(\vec{z})|^2 \int_\Xi \int_\Xi g(\vec{x}_1) \cdot g^*(\vec{x}_2) \cdot \quad \text{[Equation (20)]}$$
$$K_2(\vec{z}-\vec{x}_1, \vec{z}-\vec{x}_2) \cdot h(\vec{x}_1-\vec{x}_2) d\vec{x}_1 \cdot d\vec{x}_2$$

wherein $K_2(\vec{x}_1, \vec{x}_2) \equiv K_f(\vec{x}_1) \cdot K_f^*(\vec{x}_2)$. We assume that the working area is small enough so that $K_s$ is constant. This constant coefficient and the index f will be omitted in the subsequent development. Equation (20) can then be rewritten in the following way:

$$I(\vec{z}) = \int_{\vec{z}-\Xi}\int_{\vec{z}-\Xi} g(\vec{z}-\vec{x}_1) \cdot g^*(\vec{z}-\vec{x}_2) \cdot \quad (21)$$
$$K_2(\vec{x}_1, \vec{x}_2) \cdot h(\vec{x}_1-\vec{x}_2) d\vec{x}_1 \cdot d\vec{x}_2$$

As noted above, we assume that the influence of the camera on the PSF can be expressed as the operation of a linear filter applied in the target plane, as given by equation (3). Applying this definition to equation (20), omitting the leading coefficient, and changing the order of integration, gives:

$$C(\vec{z}) = \int_\Xi \int_\Xi g(\vec{x}_1) \cdot g^*(\vec{x}_2) \cdot \quad (22)$$
$$\tilde{K}_2(\vec{z}, \vec{x}_1, \vec{x}_2) \cdot h(\vec{x}_1-\vec{x}_2) d\vec{x}_1 \cdot d\vec{x}_2$$

wherein $\tilde{K}_2(\vec{z}, x_1, x_2) \equiv \int_\Xi C_h(\vec{z}-\vec{y}) \cdot K_2(\vec{y}-x_1, \vec{y}-x_2) d\vec{y}$.

Now substituting $\vec{z}-\vec{y} = \vec{v}$, we obtain:

$$\tilde{K}_2(\vec{z}, \vec{x}_1, \vec{x}_2) = -\int_\Xi C_h(\vec{v}) \cdot \quad \text{[Equation (23)]}$$
$$K_2(\vec{z}-\vec{x}_1-\vec{v}, \vec{z}-\vec{x}_2-\vec{v}) d\vec{v}$$
$$\equiv K_{2C}(\vec{z}-\vec{x}_1, \vec{z}-\vec{x}_2)$$

If we substitute this equation into equation (22), we obtain a result identical in form to equation (20), with the substitution of $K_{2C}$ for $K_2$. Note that both $K_{2C}$ and $K_2$ are hermitian functions. Thus, the influence of the camera does not change the form of equation (21), either.

Equation (21) can now be rewritten as follows:

$$I(\vec{z}) = \int_{\vec{z}-\Xi}\int_{\vec{z}-\Xi} g(\vec{z}-\vec{x}_1) \cdot g^*(\vec{z}-\vec{x}_2) \cdot W(\vec{x}_1, \vec{x}_2) d\vec{x}_1 \cdot d\vec{x}_2 \quad (24)$$

wherein $W(\vec{x}_1, \vec{x}_2) \equiv K_2(\vec{x}_1, \vec{x}_2) \cdot h(\vec{x}_1-\vec{x}_2)$. As noted above, both $K_2$ and h are hermitian, and thus $W(\vec{x}_1, \vec{x}_2)$ is hermitian, as well. Therefore, W can be expanded in the manner given above in equation (3). Substituting this expansion into equation (24) gives the expression of equation (4).

Appendix B—Derivation of the Gradient Matrix

Based on the definitions of $V_a$ and $D_a$ in equation (13), equation (14) may be restated as follows:

$$\text{Re}(d_{nm}) = \frac{\partial}{\partial \text{Re}(a_{nm})} \int_\Xi D_a^{2n}(\vec{z}) dz \quad (25)$$
$$= 2n \cdot \int_\Xi D_a^{2n-1}(\vec{z}) \frac{\partial}{\partial \text{Re}(a_{nm})} D_a(\vec{z}) dz$$
$$= 2n \cdot \int_\Xi D_a^{2n-1}(\vec{z}) \frac{\partial}{\partial \text{Re}(a_{nm})} \tilde{I}_a(\vec{z}) dz$$

$$\text{Im}(d_{nm}) = 2n \cdot \int_\Xi D_a^{2n-1}(\vec{z}) \frac{\partial}{\partial \text{Im}(a_{nm})} \tilde{I}_a(\vec{z}) dz$$

From equation (12):

$$\frac{\partial}{\partial \text{Re}(a_{nm})} \tilde{I}_a(\vec{z}) = \sum_{k,l=1}^n \left( \sum_{i=1}^n \frac{\partial}{\partial \text{Re}(a_{nm})}(a_{ik} \cdot a_{il}^*) \right) \circ \Psi_k \circ \Psi_l^*$$
$$\frac{\partial}{\partial \text{Im}(a_{nm})} \tilde{I}_a(\vec{z}) = \sum_{k,l=1}^n \left( \sum_{i=1}^n \frac{\partial}{\partial \text{Im}(a_{nm})}(a_{ik} \cdot a_{il}^*) \right) \circ \Psi_k \circ \Psi_l^* \quad (26)$$

The partial derivatives in this equation may be simplified by using the identities:

$$\frac{\partial}{\partial \text{Re}(a_{nm})}(a_{ik} \cdot a_{il}^*) = \begin{cases} a_{nl}^*, & \text{when } i=n, k=m \\ a_{nk}, & \text{when } i=n, l=m \\ 0, & \text{otherwise} \end{cases} \quad (27)$$

$$\frac{\partial}{\partial \text{Im}(a_{nm})}(a_{ik} \cdot a_{il}^*) = \begin{cases} ja_{nl}^*, & \text{when } i=n, k=m \\ -ja_{nk}, & \text{when } i=n, l=m \\ 0, & \text{otherwise} \end{cases}$$

Substituting these identities into equation (26), and performing some elementary transformations, gives the following result:

$$\frac{\partial}{\partial \text{Re}(a_{nm})} \tilde{I}_a(\vec{z}) = 2 \cdot \text{Re}\left( \Psi_m^* \circ \sum_{k=1}^n a_{nk} \cdot \Psi_k \right) \quad (28)$$

-continued $$\frac{\partial}{\partial \mathrm{Im}(a_{nm})} \tilde{I}_a(\vec{z}) = 2 \cdot \mathrm{Im}\left(\Psi_m^* \circ \sum_{k=1}^{n} a_{nk} \cdot \Psi_k\right)$$

Substituting this result into equation (25) gives the expression for $d_{nm}$ in equation (15).

The invention claimed is:

1. A method for generating a simulated aerial image, comprising: forming a reference aerial image of a first mask for an optical system; capturing and processing the reference aerial image so as to generate a set of expansion functions representative of aberrations in the optical system; and computing the simulated aerial image of a second mask for use in the optical system by applying the expansion functions to a design of the second mask, wherein the first mask comprises a pseudo-noise pattern characterized by a transmission function g that approximates a condition:

$$\iint g(\vec{x}-\vec{z}_1) \bullet g(\vec{x}-\vec{z}_2) \bullet g(\vec{x}-\vec{z}_3) \bullet g(\vec{x}-\vec{z}_4) d\vec{x} = G\delta(\vec{z}_1-\vec{z}_3, \vec{z}_2-\vec{z}_4)$$

wherein: G is a constant, $\vec{z}_j$ {j=1, 2, 3, 4} are arbitrary vectors. $\vec{x}$ is a vector in a mask plane in the optical system, and $\delta$ is a function of $\vec{z}_j$ {j=1, 2, 3, 4}.

2. The method according to claim 1, wherein processing the reference aerial image comprises finding the set of expansion functions so as to minimize a difference between the reference aerial image formed using the system and a simulation of the reference aerial image computed using the expansion functions.

3. The method according to claim 2, wherein finding the expansion functions comprises determining a kernel function based on properties of the optical system, and estimating a series of eigenfunctions of the kernel function.

4. The method according to claim 3, wherein finding the expansion functions comprises expressing each of the expansion functions as a linear combination of the estimated eigenfunctions multiplied by respective expansion coefficients, and determining the expansion coefficients so as to minimize the difference between the reference aerial image formed using the system and the simulation of the reference aerial image.

5. The method according to claim 4, wherein determining the expansion coefficients comprises computing a gradient of the difference with respect to the expansion coefficients, and optimizing the expansion coefficients using the gradient.

6. The method according to claim 4, wherein determining the expansion coefficients comprises defining a hermitian matrix based on the expansion coefficients, and applying a linear regression analysis to the difference between the reference aerial image formed using the system and the simulation of the reference aerial image in order to compute elements of the hermitian matrix.

7. The method according to claim 1, wherein capturing the reference aerial image comprises capturing the image using a camera having optical properties, and wherein processing the reference aerial image comprises determining the expansion functions so as to take into account the optical properties of the camera.

8. The method according to claim 1, and comprising forming and capturing an actual aerial image of the second mask using the optical system, and comparing the actual aerial image to the simulated aerial image so as to evaluate the second mask.

9. The method according to claim 8, wherein comparing the actual aerial image to the simulated aerial image comprises detecting a difference between the actual aerial image to the simulated aerial image, and identifying a defect in the second mask if the difference is greater than a predetermined threshold.

10. Apparatus for modeling an optical system, comprising: a camera, which is adapted to capture a reference aerial image of a first mask for the optical system, which image is formed using the optical system; and an image processor, which is adapted to process the reference aerial image so as to generate a set of expansion functions representative of aberrations in the optical system, and to compute a simulated aerial image of a second mask for use in the optical system by applying the expansion functions to a design of the second mask, wherein the first mask comprises a pseudo-noise pattern characterized by a transmission function g that approximates a condition:

$$\iint g(\vec{x}-\vec{z}_1) \bullet g(\vec{x}-\vec{z}_2) \bullet g(\vec{x}-\vec{z}_3) \bullet g(\vec{x}-\vec{z}_4) d\vec{x} = G\delta(\vec{z}_1-\vec{z}_3, \vec{z}_2-\vec{z}_4)$$

wherein: G is a constant, $\vec{z}_j$ {j=1, 2, 3, 4} are arbitrary vectors, $\vec{x}_j$ is a vector in a mask plane in the optical system, and $\delta$ is a function of $\vec{z}_j$ {j=1, 2, 3, 4}.

11. The apparatus according to claim 10, wherein the image processor is adapted to find the expansion functions so as to minimize a difference between the reference aerial image formed using the system and a simulation of the reference aerial image computed using the expansion functions.

12. The apparatus according to claim 11, wherein the image processor is adapted to find the expansion functions by determining a kernel function based on properties of the optical system, and estimating a series of elgenfunctions of the kernel function.

13. The apparatus according to claim 12, wherein the image processor is adapted to express each of the expansion functions as a linear combination of the estimated eigenfunctions multiplied by respective expansion coefficients, and to determine the expansion coefficients so as to minimize the difference between the reference aerial image formed using the system and the simulation of the reference aerial image.

14. The apparatus according to claim 13, wherein the image processor is adapted to determine the expansion coefficients by computing a gradient of the difference with respect to the expansion coefficients, and optimizing the expansion coefficients using the gradient.

15. The apparatus according to claim 13, wherein the image processor is adapted to determine the expansion coefficients by defining a hermitian matrix based on the expansion coefficients, and applying a linear regression analysis to the difference between the reference aerial image formed using the system and the simulation of the reference aerial image in order to compute elements of the hermitian matrix.

16. The apparatus according to claim 10, wherein the camera is characterized by optical properties, and wherein the expansion functions take into account the optical properties of the camera.

17. The apparatus according to claim 10, wherein the camera is adapted to capture an actual aerial image of the second mask formed using the optical system, and wherein the image processor is adapted to compare the actual aerial image to the simulated aerial image so as to evaluate the second mask.

18. The apparatus according to claim 17, wherein the image processor is adapted to detect a difference between the actual aerial image to the simulated aerial image, and to identify a defect in the second mask if the difference is greater than a predetermined threshold.

19. Apparatus for mask inspection, comprising: an optical system, which is adapted to form aerial images of masks, the aerial images comprising a reference aerial image of a first mask for use in the optical system and an actual aerial image of a second mask for use in the optical system; a camera, which is adapted to capture the aerial images formed by the optical system; and an image processor, which is adapted to process the reference aerial image so as to generate a set of expansion functions representative of aberrations in the optical system, and to compute a simulated aerial image of a second mask by applying the expansion functions to a design of the second mask, and to compare the actual aerial image to the simulated aerial image so as to evaluate the second mask, wherein the first mask comprises a pseudo-noise pattern characterized by a transmission function g that approximates a condition:

$$\iint g(\vec{x} - \vec{z}_1) \bullet g(\vec{x} - \vec{z}_2) \bullet g(\vec{x} - \vec{z}_3) \bullet g(\vec{x} - \vec{z}_4) d\vec{x} = G\delta(\vec{z}_1 - \vec{z}_3, \vec{z}_2 - \vec{z}_4)$$

wherein: G is a constant, $\vec{z}_j$ {j=1, 2, 3, 4} are arbitrary vectors, $\vec{x}$ is a vector in a mask plane in the optical system, and $\delta$ is a function of $\vec{z}_j$ {j=1, 2, 3, 4}.

20. The apparatus according to claim 19, wherein the image processor is adapted to detect a difference between the actual aerial image to the simulated aerial image, and to identify a defect in the second mask if the difference is greater than a predetermined threshold.

21. A computer software product for modeling an optical system, the product comprising a computer-readable medium, in which program instructions are stored, which instructions, when read by a computer, cause the computer to process a reference aerial image of a first mask for use in the optical system, which image is formed using the optical system, so as to generate a set of expansion functions representative of aberrations in the optical system, and to compute a simulated aerial image of a second mask for use in the optical system by applying the expansion functions to a design of the second mask, wherein the first mask comprises a pseudo-noise pattern characterized by a transmission function g that approximates a condition:

$$\iint g(\vec{x} - \vec{z}_1) \bullet g(\vec{x} - \vec{z}_2) \bullet g(\vec{x} - \vec{z}_3) \bullet g(\vec{x} - \vec{z}_4) d\vec{x} = G\delta(\vec{z}_1 - \vec{z}_3, \vec{z}_2 - \vec{z}_4)$$

wherein: G is a constant, $\vec{z}_j$ {j=1, 2, 3, 4} are arbitrary vectors, $\vec{x}$ is a vector in a mask plane in the optical system, and $\delta$ is a function of $\vec{z}_j$ {j=1, 2, 3, 4}.

* * * * *